United States Patent
Gao

(10) Patent No.: US 12,193,197 B2
(45) Date of Patent: Jan. 7, 2025

(54) FULL SYSTEM SELF-REGULATING ARCHITECTURE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 665 days.

(21) Appl. No.: 17/194,081

(22) Filed: Mar. 5, 2021

(65) Prior Publication Data

US 2022/0287208 A1   Sep. 8, 2022

(51) Int. Cl.
H05K 7/20   (2006.01)

(52) U.S. Cl.
CPC ..... H05K 7/20836 (2013.01); H05K 7/20809 (2013.01)

(58) Field of Classification Search
CPC .......... H05K 7/20836; H05K 7/20809; H05K 7/20381; H05K 7/20818; H05K 7/20827; H05K 7/208; H05K 7/20318
(Continued)

(56) References Cited

U.S. PATENT DOCUMENTS

| 6,182,742 B1 * | 2/2001 | Takahashi ......... | H05K 7/20281 |
| | | | 165/200 |
| 7,436,666 B1 * | 10/2008 | Konshak ................... | G06F 1/20 |
| | | | 165/80.4 |

(Continued)

FOREIGN PATENT DOCUMENTS

| JP | 2007116055 A | 5/2007 |
| JP | 2015183993 A * | 10/2015 |

(Continued)

OTHER PUBLICATIONS

Rickard Brännvall, Mikko Siltala, Jonas Gustafsson, Jeffrey Sarkinen, Mattias Vesterlund, and Jon Summers. 2020. EDGE: Microgrid Data Center with Mixed Energy Storage. In Proceedings of the Eleventh ACM International Conference on Future Energy Systems (e-Energy '20). Association for Computing Mach. (Year: 2020).*

(Continued)

*Primary Examiner* — Thienvu V Tran
*Assistant Examiner* — Sreeya Sreevatsa
(74) *Attorney, Agent, or Firm* — WOMBLE BOND DICKINSON (US) LLP

(57) ABSTRACT

Disclosed is an integrated thermal and electrical system with self-regulating capabilities to provide enhanced cooling capacity and auxiliary power. The system includes two cooling loops, a primary cooling loop whose cooling capacity is fixed and a secondary cooling loop that supplements the primary cooling loop when the cooling capacity of the primary cooling loop is insufficient. The two cooling loops may use a phase change fluid whose vapor pressure is monitored to control the cooling capacity of the secondary cooling loop to respond to fluctuating thermal load. The system includes two types of energy sources such as a photovoltaic system and a power storage. The photovoltaic system may power the secondary cooling loop to control the fluid flow rate or the airflow rate through the secondary cooling loop based on the vapor pressure. The photovoltaic system may charge the power storage when not powering the secondary cooling loop.

20 Claims, 8 Drawing Sheets

(58) Field of Classification Search
USPC .......................................................... 361/170
See application file for complete search history.

(56) References Cited

U.S. PATENT DOCUMENTS

| | | | | |
|---|---|---|---|---|
| 7,832,461 | B2* | 11/2010 | Belady | H05K 7/20836 165/80.4 |
| 10,098,260 | B2* | 10/2018 | Bouras | H05K 7/20318 |
| 10,966,349 | B1* | 3/2021 | Lau | H05K 7/20236 |
| 2007/0089859 | A1* | 4/2007 | Wei | H01L 23/473 257/E23.098 |
| 2008/0266726 | A1* | 10/2008 | Murakami | H05K 7/2079 361/1 |
| 2011/0056225 | A1* | 3/2011 | Campbell | H05K 7/20381 62/223 |
| 2012/0048514 | A1 | 3/2012 | Osbaugh | |
| 2014/0077595 | A1* | 3/2014 | Kakuya | H02J 7/0024 307/24 |
| 2016/0120059 | A1* | 4/2016 | Shedd | F28F 3/12 165/244 |
| 2020/0214173 | A1 | 7/2020 | Sato et al. | |

FOREIGN PATENT DOCUMENTS

| | | |
|---|---|---|
| JP | 2016056988 A | 4/2016 |
| JP | 2018074648 A | 5/2018 |
| WO | 2014132452 A1 | 9/2014 |
| WO | 2014141396 A1 | 9/2014 |
| WO | 2019146535 A1 | 8/2019 |
| WO | 2020203996 A1 | 10/2020 |

OTHER PUBLICATIONS

Rickard Brännvall, Mikko Siltala, Jonas Gustafsson, Jeffrey Sarkinen, Mattias Vesterlund, and Jon Summers. 2020. EDGE: Microgrid Data Center with Mixed Energy Storage. In Proceedings of the Eleventh ACM International Conference on Future Energy Systems (e-Energy '20) (Year: 2020).*

* cited by examiner

FULL SYSTEM SELF-REGULATING ARCHITECTURE

FIELD OF THE INVENTION

Embodiments of the present invention relate generally to server and data center cooling. More particularly, embodiments of the invention relate to integrated thermal and electrical system designs with self-regulating capabilities to provide cooling and power to data centers with high power density racks and clusters.

BACKGROUND

Cooling is a critical consideration in a computer system and data center design. The number of high performance electronics components such as high performance processors packaged inside servers has steadily increased, increasing the amount of heat generated and to be dissipated during the ordinary operations of the servers. The reliability of servers used within a data center decreases if the thermal environment in which they operate is permitted to increase in temperature over time. Maintaining a proper thermal environment is critical for normal operations of these servers in data centers, as well as for maximizing the server performance, reliability and lifetime. It requires more effective and efficient cooling solutions especially in the cases of cooling these high performance servers.

Servers and other high performance electronic components such as central processing units (CPU), graphical processing units (GPU), etc., are usually tightly packaged in clusters of highly integrated chips, boards, or racks to yield very high power and heat densities. In addition to meeting constantly increasing cooling capacity, increasing power density also demands that data centers be able to flexibility increase their electrical power capacity. Improvements in energy and power efficiency are needed to reduce the operating cost of powering high-performance data centers, mitigate the environmental impact and to satisfy sustainability goals and regulatory requirements. Existing solutions to meet the dual demands of increased power density and cooling capability may require the design of a large amount of power and cooling buffers that are difficult to scale or are inefficiently used during the lifetime of the data centers. The power and cooling systems may also not be integrated and controlled to meet short-term fluctuating demands. Thus, there is a need for integrated thermal and electrical system designs that are scalable, reliable, efficient, serviceable, and low cost to meet the thermal and power management needs of high performance electronic components in data centers. In addition, it becomes more important to develop and deploy renewable energy source for powering data centers due to environmental regulations.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
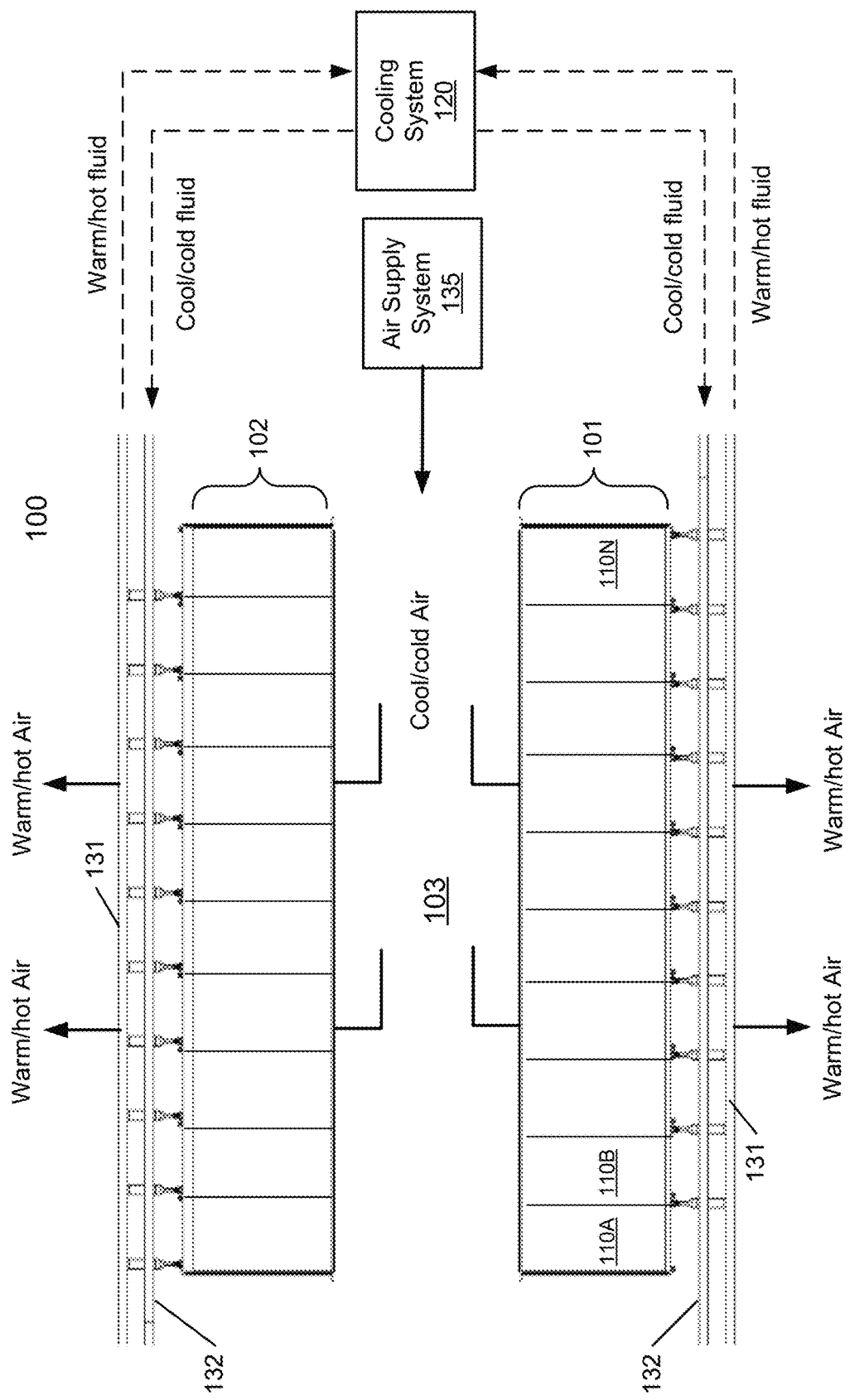
FIG. 1 is a block diagram illustrating an example of a data center facility according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Disclosed are designs for an integrated thermal and electrical system with self-regulating capabilities to provide enhanced cooling capacity and auxiliary power to support high thermal and power density requirements of computer systems or data centers. In one aspect, the thermal system of the integrated design includes two cooling loops, a primary cooling loop whose cooling capacity is fixed for normal operation and a secondary cooling loop that supplements the primary cooling loop when the fixed cooling capacity of the primary cooling loop is insufficient. Both the primary and secondary cooling loops have a corresponding condenser that acts as a heat exchange unit. Each condenser may have a secondary loop to deliver cooling liquid to electronic racks of the data center to remove heat generated by the servers or other electronic components of the racks. Each condenser may have a primary loop coupled to external cooling liquid supply and return lines to carry fluid to exchange heat with the secondary loop. The secondary loop of each condenser may use a phase change fluid whose vapor pressure varies due to the thermal load of the servers or electronic components. When the secondary cooling loop is connected to supplement the cooling capacity of the primary cooling loop, the system may control the fluid flow rate in the primary loop of the secondary condenser or the airflow rate through the secondary condenser based on the vapor pressure of the phase change fluid to respond to fluctuations in the thermal load.

In one aspect, the electrical system includes a photovoltaic system and a power storage system to provide auxiliary power to supplement the main utility power. The photovoltaic system may power the primary loop of the secondary condenser to control the fluid flowrate or the airflow rate through the secondary condenser based on the vapor pressure of the phase change fluid. The photovoltaic system may charge the power storage system when not powering the secondary cooling loop. The power storage system may be a battery used to power the primary loop of the secondary condenser when the power of the photovoltaic system is unavailable or insufficient. In one aspect, the power storage system may power the primary cooling loop. In one aspect, the power storage system may provide auxiliary power to the electronic components in response to increased power demand of the computer systems or data centers. The integrated thermal and electrical system with self-regulating capabilities provides efficient thermal and power management of high performance IT clusters, increasing cooling performance, cooling reliability, power efficiency, system scalability, sustainability requirements, and lowering cost to meet the demands of high heat and power densities.

In one aspect, the photovoltaic and power storage systems are shared among multiple racks or IT clusters to regulate the cooling capacity and electrical loads of the racks or IT clusters. A controller may receive the vapor pressure to individually connect and control the cooling capacity of the secondary cooling loop to each rack to respond to the variation in the vapor pressure due to its corresponding thermal load. The controller may additionally receive the voltages and availabilities of the photovoltaic and power storage systems for use in conjunction with the information on the vapor pressure from each rack to regulate the power to the primary loop of the secondary condenser of each rack from the photovoltaic system or the power storage system.

In one aspect, a photovoltaic system is dedicated for each rack but the power storage system is shared among multiple racks to regulate the cooling capacity and electrical loads of the racks. A controller may receive the vapor pressure to individually connect and control the cooling capacity of the secondary cooling loop to each rack in response to the variation in the vapor pressure due to its corresponding thermal load. The controller may additionally receive the voltages of the dedicated photovoltaic systems and the shared power storage systems for use in conjunction with the information on the vapor pressure from each rack to regulate the power to the primary loop of the secondary condenser of each rack from its dedicated photovoltaic system or the shared power storage system.

In one aspect, a secondary condenser and a fluid storage system of the secondary cooling loop is shared among multiple racks. The multiple racks also share the photovoltaic system and the power storage system. A controller may receive the vapor pressure from each rack to individually connect and control the cooling capacity of the secondary cooling loop to each rack from the shared secondary condenser and fluid storage system. The fluid vapor line of the secondary cooling loop from each rack is connected to the shared secondary condenser. The return of the shared secondary condenser is connected to the fluid storage system. The liquid fluid supply line of the secondary cooling loop for each rack is connected to the fluid storage system and is regulated by the controller based on the corresponding vapor pressure of the rack in response to its thermal load. The controller may regulate the power to the primary loop of the shared secondary condenser from the photovoltaic system or the power storage system. The power storage system may be charged by the photovoltaic system or the main utility power to power the primary cooling loop or the electronic components of the racks.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes one or more rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied. For example, two rows of electronic racks may back to back face each other without forming an aisle in between, while their frontends face away from each other. The backends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 may be coupled to multiple data center systems such as data center system 100.

In one embodiment, cooling system 120 includes an external liquid loop connected to a cooling tower or a dry cooler external to the building/housing container. The cooling system 120 can include, but is not limited to evaporative cooling, free air, rejection to large thermal mass, and waste heat recovery designs. Cooling system 120 may include or be coupled to a cooling liquid source that provide cooling liquid.

In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack.

In one embodiment, the cooling liquid manifold disposed on the backend of each electronic rack is coupled to liquid supply line 132 (also referred to as a room supply manifold) to receive cooling liquid from cooling system 120. The cooling liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 (also referred to as a room return manifold) back to cooling system 120.

Liquid supply/return lines 131-132 are referred to as data center or room liquid supply/return lines (e.g., global liquid supply/return lines), which supply cooling liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server chassis in the electronic rack to deliver the cooling liquid to the cold plates of the processors. In one embodiment, liquid supply/return lines 131-132 may be connected to the primary loop of the condenser of the primary or secondary cooling loop of the integrated thermal and electrical system with two cooling loops to be discussed.

In one embodiment, data center system 100 further includes an optional airflow delivery system 135 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air to circulate from aisle 103 through electronic racks 110A-110N to carry away exchanged heat. In one embodiment, the airflow of cool/cold air may be delivered to the condenser of the primary or secondary cooling loop of the integrated thermal and electrical system with two cooling loops to be discussed.

The cool airflows enter the electronic racks through their frontends and the warm/hot airflows exit the electronic racks from their backends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling.

Figure 2:
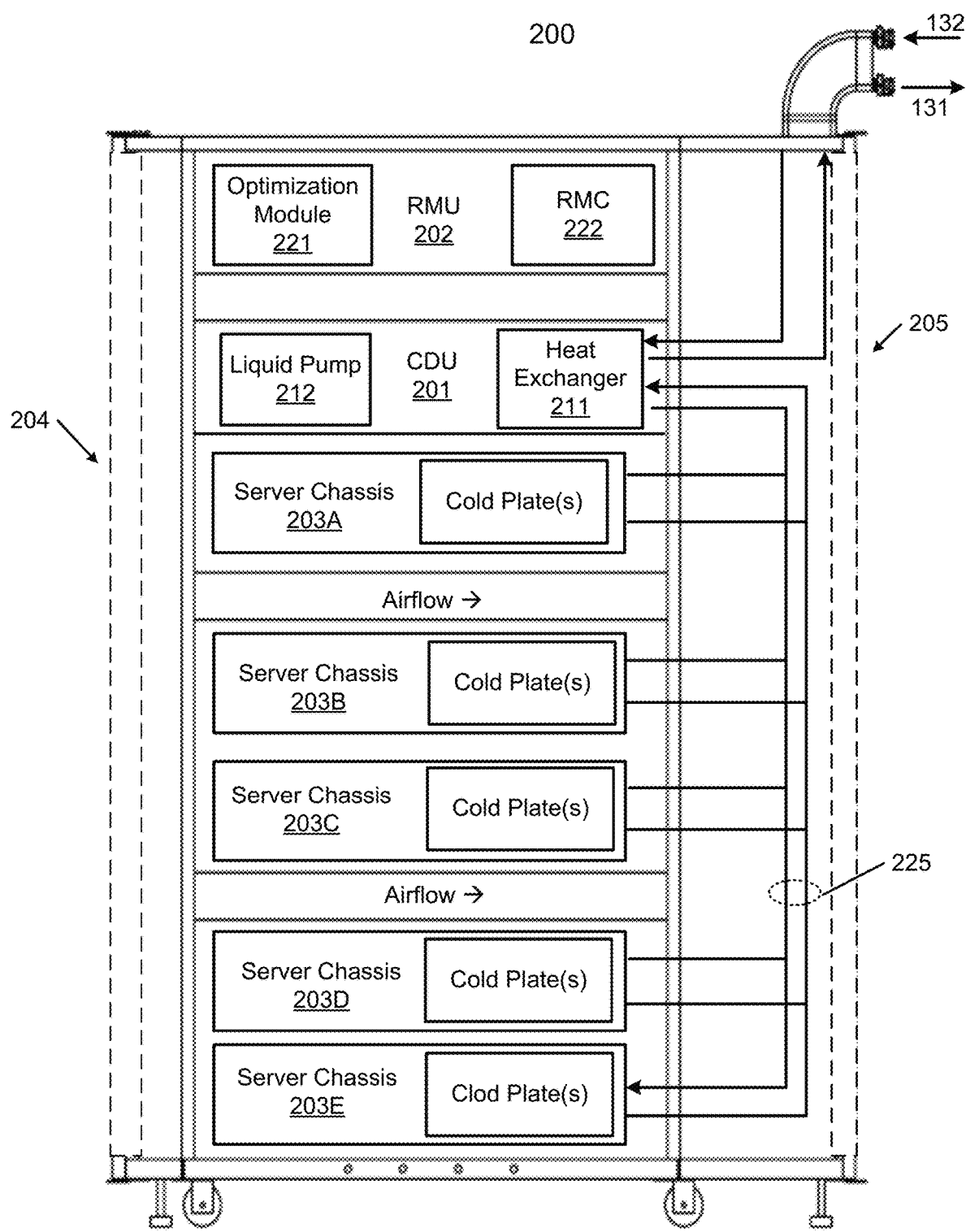
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, rack management unit (RMU) 202, and one or more server chassis 203A-203E (collectively referred to as server chassis 203). Server chassis 203 can be inserted into an array of server slots (e.g., standard shelves) respectively from frontend 204 or backend 205 of electronic rack 200. Note that although there are five server chassis 203A-203E shown here, more or fewer server chassis may be maintained within electronic rack 200. Also note that the particular positions of CDU 201, RMU 202, and/or server chassis 203 are shown for the purpose of illustration only; other arrangements or configurations of CDU 201, RMU 202, and/or server chassis 203 may also be implemented. In one embodiment, electronic rack 200 can be either open to the environment or partially contained by a rack container, as long as the cooling fans can generate airflows from the frontend to the backend.

In addition, for at least some of the server chassis 203, an optional fan module (not shown) is associated with the server chassis. Each of the fan modules includes one or more cooling fans. The fan modules may be mounted on the backends of server chassis 203 or on the electronic rack to generate airflows flowing from frontend 204, traveling through the air space of the sever chassis 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, may be coupled to cooling system 120 as described above.

In addition, heat exchanger 211 further includes a second loop with two ports having a second pair of liquid connectors coupled to liquid manifold 225 (also referred to as a rack manifold) to form a secondary loop, which may include a supply manifold (also referred to as a rack liquid supply line or rack supply manifold) to supply cooling liquid to server chassis 203 and a return manifold (also referred to as a rack liquid return line or rack return manifold) to return warmer liquid back to CDU 201. Note that CDUs 201 can be any kind of CDUs commercially available or customized ones. Thus, the details of CDUs 201 will not be described herein. In one embodiment, the heat exchanger 211 in the CDU 201 may be the condenser of the primary or secondary cooling loop of the integrated thermal and electrical system with two cooling loops to be discussed.

Each of server chassis 203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by fan modules and liquid pump 212, which may be proportional to their respective speeds. These operating data are referred to as real-time operating data. Note that the monitor may be implemented as a separate module within RMU 202. In one embodiment, RMU 202 or RMC 222 may be a controller that monitors the vapor pressure of the phase change fluid in the secondary loop of the condenser of the secondary cooling loop of the integrated thermal and electrical system with two cooling loops to be discussed.

Based on the operating data, optimization module 221 performs an optimization using a predetermined optimization function or optimization model to derive a set of optimal fan speeds for fan modules and an optimal pump speed for liquid pump 212, such that the total power consumption of liquid pump 212 and fan modules reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of fan modules based on the optimal pump speeds and fan speeds. In one embodiment, RMU 202, RMC 222, or optimization module 222 may be a controller that controls the fluid flow rate in the primary loop of the condenser of the secondary cooling loop, or may control the airflow rate through the condenser of the secondary cooling loop, of the integrated thermal and electrical system with two cooling loops to be discussed.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server chassis 203. Similarly, based on the optimal fan speeds, RMC 222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 2 is shown and described for the purpose of illustration only; other configurations or arrangements may also be applicable. For example, CDU 201 may be an optional unit. The cold plates of server chassis 203 may be coupled to a rack manifold, which may be directly coupled to room manifolds 131-132 without using a CDU. Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 3:
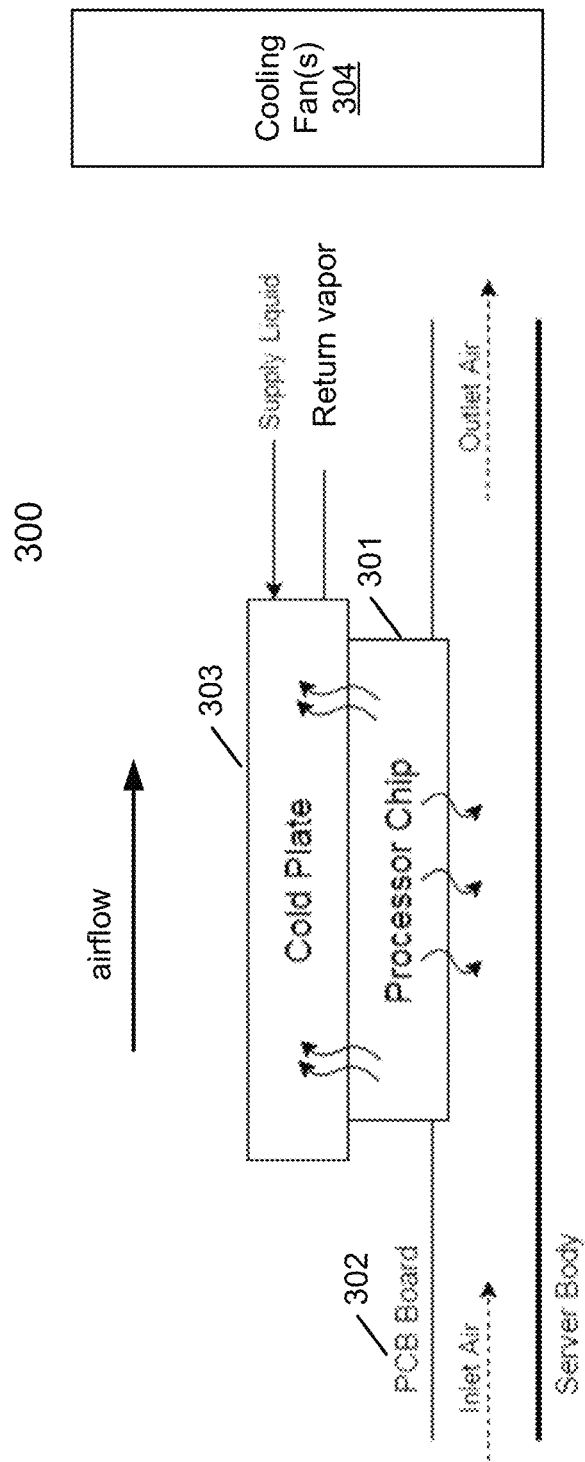
FIG. 3 is a block diagram illustrating an example of a cold plate configuration according to one embodiment.

FIG. 3 is a block diagram illustrating a processor cold plate configuration according to one embodiment. The processor/cold plate assembly 300 can represent any of the processors/cold plate structures of server chassis 203 as shown in FIG. 2. Referring to FIG. 3, processor 301 is plugged onto a processor socket mounted on printed circuit board (PCB) or motherboard 302 coupled to other electrical components or circuits of a data processing system or server. Processor 301 also includes a cold plate 303 attached to it, which is coupled to a rack manifold that is coupled to a liquid supply line and/or a vapor return line. In one embodiment, cold plate 303 may be a cooling device that is coupled to the secondary loop of the condenser of the primary or secondary cooling loop to be discussed in FIG. 4. The liquid supply line may supply the cooling liquid of the phase change fluid to the cooling device. The return line may return the heated vapor of the phase change fluid from the cooling device. A portion of the heat generated by processor 301 is removed by the cooling liquid via cold plate 303. The remaining portion of the heat enters into an air space underneath or above, which may be removed by an airflow generated by cooling fan 304.

Figure 4:
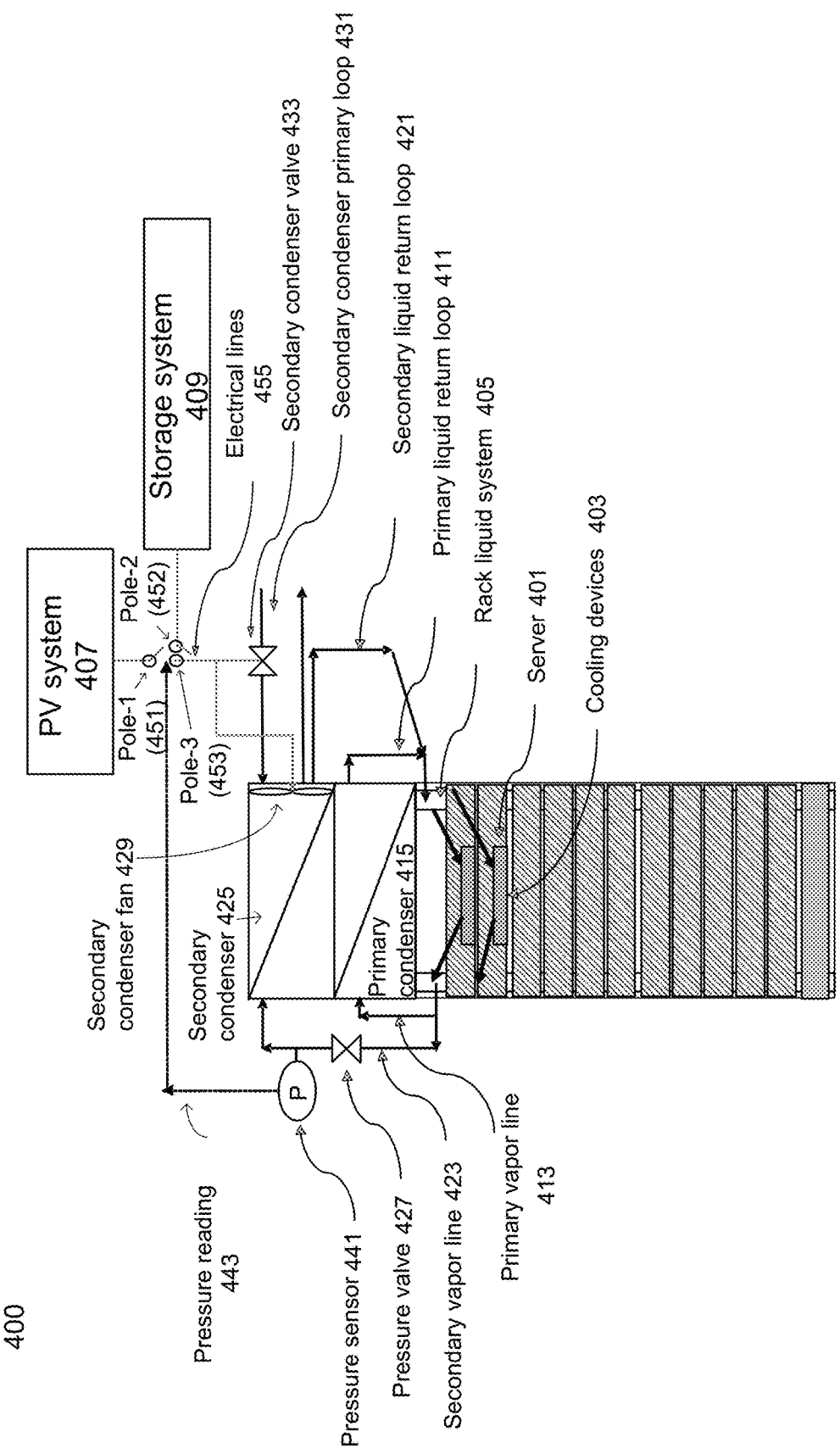
FIG. 4 illustrates an example of the thermal, power, and control architecture of an integrated system to provide enhanced cooling capability and auxiliary power for a rack of electronic components of a data center according to one embodiment.

FIG. 4 illustrates an example of the thermal, power, and control architecture of an integrated system 400 to provide enhanced cooling capability and auxiliary power for a rack of electronic components of a data center according to one embodiment. The integrated system includes the thermal subsystem to remove heat generated by the electronic components, the electrical subsystem to power the thermal subsystem and the electronic components, and the control subsystem to control the operation of the thermal and electrical subsystem in response to fluctuations in the thermal and electrical loads. The electronic components in the rack may include a server 401 or other IT components on a server chassis inserted into a corresponding standard shelf of the rack.

The thermal subsystem includes two cooling loops, a primary cooling loop whose cooling capacity is fixed for normal operation and a secondary cooling loop that supplements the primary cooling loop when the fixed cooling capacity of the primary cooling loop is insufficient to remove heat generated by the electronic components. The control subsystem controls or adjusts only the cooling capacity of the secondary cooling loop to respond to fluctuations in the heat load. Both the primary and secondary cooling loops may use a phase change fluid that changes its phase from liquid to vapor when thermal energy is absorbed and from vapor to liquid when thermal energy is dissipated. The vapor pressure of the phase change fluid may correspond to the amount of thermal energy absorbed.

Both the primary and secondary cooling loops have a corresponding condenser that acts as a heat exchanger. Each condenser may have a secondary loop that is coupled to the server chassis in the electronic rack to deliver the cooling liquid to the cooling devices 403 or cold plates to remove heat generated by the server 401 or other IT components. Each condenser may have a primary loop coupled to external liquid supply and return lines to carry fluid to exchange heat with the secondary loop. For example, the primary cooling loop has a primary condenser 415 with a primary loop (not shown) connected to external liquid supply and return lines that recirculate fluid to remove heat carried by the heated vapor of the phase change fluid of a secondary loop, thereby changing the phase of the phase change fluid in the secondary loop from vapor to liquid. The cooled liquid in the secondary loop of the primary condenser 415 after the heat exchange is returned to the cooling devices 403 through the primary liquid return loop 411.

Analogously, the secondary cooling loop has a secondary condenser 425 with a primary loop 431 coupled to external liquid supply and return lines that recirculate fluid to remove heat carried by the heated vapor of a secondary loop. In one aspect, the control subsystem controls the cooling capacity of the primary loop 431 of the secondary condenser 425 by adjusting the fluid flow rate supplied to the primary loop 431 through a secondary condenser valve 433. In one aspect, the control subsystem may control the cooling capacity of the primary loop of the secondary condenser 425 by adjusting the pumping speed or frequency of a variable-speed pump (not shown) to vary the flow rate of the fluid. In one aspect, the control subsystem may control the cooling capacity of the primary loop of the secondary condenser 425 by adjusting the speed of a secondary condenser fan 429 to vary the airflow rate to the secondary condenser 425.

The cooled liquid in the secondary loop of the secondary condenser 425 after the heat exchange with the primary loop 431 is returned to the cooling device 403 through the secondary liquid return loop 421. The liquid from the primary liquid return loop 411 is combined with the liquid from the secondary liquid return loop 421 to form the rack liquid system 405 that supplies the phase change fluid to the cooling devices 403 in the multiple server chassis in the rack. The rack liquid system 405 also returns the phase change fluid from the multiple server chassis through the primary vapor line 413 to the primary condenser 415 to complete the secondary loop of the primary condenser 415, or returns the phase change fluid through the secondary vapor line 423 to the secondary condenser 425 to complete the secondary loop of the secondary condenser 425. The secondary vapor line 423 is connected to the secondary condenser through the pressure valve 427. The pressure valve 427 is closed under normal operation when the vapor pressure is low to prevent the phase change fluid in the secondary vapor line 423 from returning to the secondary condenser 425. The pressure valve 427 may open to discharge the phase change fluid in the secondary vapor line 423 to the secondary condenser 425 when the vapor pressure reaches a triggered pressure threshold.

When the phase change fluid in the rack liquid system 405 absorbs the heat generated within the server 401 from the cooling devices 403, the phase change fluid may change its phase from liquid to vapor. Under normal operating condition, the phase change fluid is returned to the primary condenser 415 through the primary vapor line 413 to exchange heat with the primary loop of the primary condenser 415. If the cooling capacity of the primary cooling loop is sufficient based on the current rack density, the vapor pressure in the secondary vapor line 423 stays below the triggered pressure threshold of the pressure valve 427. As a result, the pressure valve 427 is closed and the phase change liquid is not circulated through the secondary loop of the secondary condenser 425. The primary loop 431 of the secondary condenser 425 may also shut down to save power as the secondary condenser valve 433 is closed. In one embodiment, the secondary condenser fan 429 is powered off. In one embodiment, the secondary condenser 425 is equipped with either the secondary condenser fan 429 or the secondary condenser primary loop 431. If the secondary condenser is a liquid cooling condenser using cooling liquid to cool the vapor in the secondary loop, the secondary condenser primary loop 431 is used to supply the cooling liquid. If the secondary condenser is an air cooling condenser using cooling airflow to cool the vapor in the secondary loop (such as data center room cooling air), the secondary condenser fan 429 is used for blowing the airflow to cool the vapor back to liquid. In this scenario, the secondary condenser primary loop 431 is not needed.

The electrical subsystem includes the photovoltaic system 407 and the storage system 409 to power the primary loop of the secondary condenser 425 in response to the thermal load of the rack. The photovoltaic system 407 or the storage system 409 may power the primary loop of the secondary condenser 425 through electrical lines 455 to the secondary condenser valve 433 or the secondary condenser fan 429. The storage system 409 may be a battery based energy storage system that includes one or more battery cells, as well as the necessary charging and discharging circuits for charging and discharging the battery cells. A pressure sensor 441 measuring the vapor pressure of the secondary vapor line 423 on the discharge side of the pressure valve 427 controls the power distribution of the photovoltaic system 407 and the storage system 409. During normal operating condition when the primary cooling loop provides sufficient cooling capacity, the pressure valve 427 is closed because the vapor pressure in the secondary vapor line 423 does not exceed the triggered pressure threshold of the pressure valve 427. A low pressure reading 443 from the pressure sensor 441 causes an electrical switch to be in the pole-1 (451) to pole-2 (452) switching position to enable the photovoltaic system 407 to charge the storage system 409. In this scenario, the photovoltaic system 407 is not powering the secondary cooling loop.

When the cooling capacity of the primary cooling loop is not sufficient to remove heat from the secondary loop of the primary condenser 415, such as when the ambient temperature is high, the vapor pressure in the secondary vapor line 423 builds up. When the vapor pressure exceeds the triggered pressure threshold of the pressure valve 427, the pressure valve 427 opens to discharge the heated vapor of the secondary vapor line 423 to the secondary loop of the secondary condenser 425 and to the pressure sensor 441. A high pressure reading 443 of the vapor pressure from the pressure sensor 441 may cause the electrical switch to switch to the pole-1 (451) to pole-3 (453) position to power the primary loop 431 of the secondary condenser 425. The secondary condenser valve 433 opens to supply cooling fluid to the primary loop 431 of the secondary condenser 425, enabling the secondary cooling loop to enhance the cooling capacity of the primary cooling loop. In one embodiment, the secondary condenser fan 429 powers on to supply air flow to cool the secondary condenser 425.

In one aspect, the pressure reading 443 controls the amount of power flowing to the primary loop 431 of the secondary condenser 425 to change the volumetric flow rate of the cooling liquid through the secondary condenser valve 433 or to change the rate of airflow from the secondary condenser fan 429 to regulate the cooling capacity of the secondary cooling loop in response to the vapor pressure of the secondary vapor line 423. In one aspect, the electrical switch may switch to the pole-2 (452) to pole-3 (453) position to use the storage system 409 to power the primary loop 431 of the secondary condenser 425 when the power from the photovoltaic system 407 is not sufficient. In one aspect, if the increased power load of the server 401 or other IT components of the server chassis causes the pressure reading 443 to increase beyond the pressure reading 443 associated with a nominal power load, the storage system 409 may provide auxiliary power to the IT load as well as powering the secondary cooling loop. In one aspect, the storage system 409 may power the primary cooling loop or the primary loop of the primary condenser 415. The integrated thermal and electrical system 400 with self-regulating capabilities provides efficient thermal and power management, increasing cooling performance, cooling reliability, power efficiency, system scalability, sustainability requirements, and lowering cost.

Figure 5:
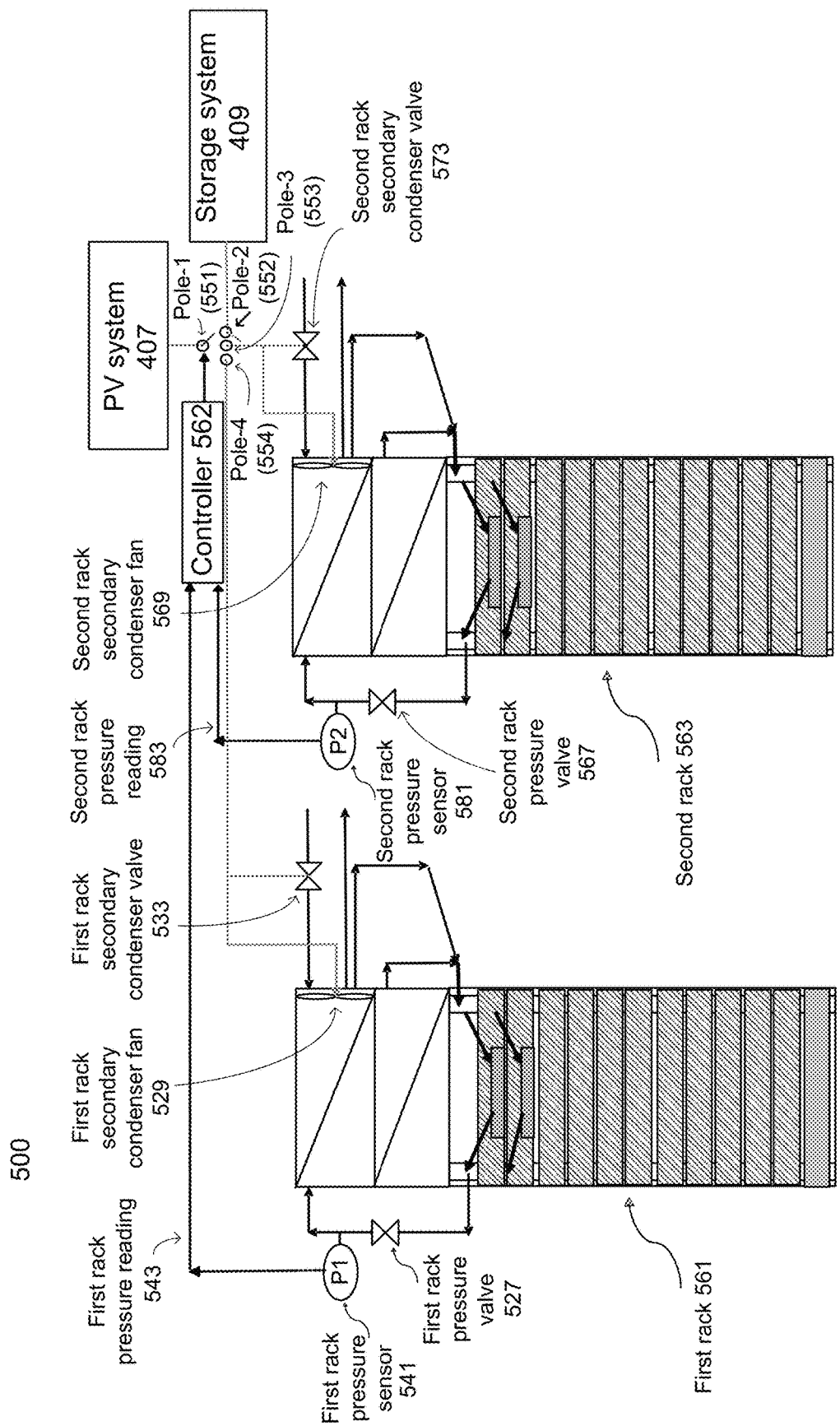
FIG. 5 illustrates an example of the thermal, power, and control architecture of an integrated system that shares a photovoltaic system and an energy storage system to regulate the cooling capacity and electrical loads among multiple racks according to one embodiment.

FIG. 5 illustrates an example of the thermal, power, and control architecture of an integrated system 500 that shares a photovoltaic system 407 and an energy storage system 409 to regulate the cooling capacity and electrical loads among multiple racks according to one embodiment. Two racks are shown, a first rack 561 and a second rack 563. Each rack has a primary cooling loop and a secondary cooling loop that enhances the cooling capacity of the primary cooling loop. The primary cooling loops and the secondary cooling loop each has a corresponding condenser to perform heat exchange between a primary loop and a secondary loop as described in FIG. 4, the detailed operations of which are omitted for sake of brevity. Even though both a valve for a liquid cooling secondary condenser and a fan for an air cooling secondary condenser are shown for both racks in FIG. 5, only one type of secondary condenser is needed. Either the valve or the fan may be omitted as discussed with regards to FIG. 4.

The first rack 561 has a first rack secondary condenser valve 533 to adjust the volumetric flow rate of the fluid supplied to the primary loop of its secondary condenser. In one embodiment, the first rack 561 has a first rack secondary condenser fan 529 to adjust the airflow rate to the secondary condenser. Similarly, the second rack 563 has a second rack secondary condenser valve 573 to adjust the volumetric flowrate of the fluid supplied to the primary loop of its secondary condenser. In one embodiment, the second rack 563 has a second rack secondary condenser fan 569 to adjust the airflow rate to its secondary condenser.

During normal operating condition when the primary cooling loop provides sufficient cooling capacity to the first rack 561 or the second rack 563, a first rack pressure valve 527 or a second rack pressure value 567, respectively, is closed because the vapor pressure in the secondary loop of the secondary condenser does not exceed the triggered pressure threshold. A first rack pressure sensor 541 may measure a low pressure value on the first rack pressure reading 543 due to the vapor pressure being lower than the triggered pressure threshold for opening the first rack pressure valve 527. A second rack pressure sensor 581 may measure a low pressure value on the second rack pressure reading 583 due to the vapor pressure being lower than the triggered pressure threshold for opening the second rack pressure valve 567. A controller 562 may read the first rack pressure reading 543 or the second rack pressure reading 583 to cause an electrical switch to be in the pole-1 (551) to pole-2 (553) switching position to enable the photovoltaic system 407 to charge the storage system 409. In this scenario, the photovoltaic system 407 is not powering the secondary cooling loop of the first rack 561 or the second rack 563.

When the cooling capacity of the primary cooling loop of either the first rack 561 or the second rack 563 is not sufficient to remove heat from the secondary loop of the corresponding primary condenser, the vapor pressure in the secondary loop of the corresponding secondary condenser may exceed the triggered pressure threshold of the first rack pressure valve 527 or the second rack pressure valve 567, respectively. The first rack pressure valve 527 or the second rack pressure valve 567 may open to discharge the heated vapor to the secondary loop of the corresponding secondary condenser. The first rack pressure sensor 541 or the second rack pressure sensor 581 may produce a high pressure reading.

The controller 562 may read the first rack pressure reading 543 to switch an electrical switch to the pole-1 (551) to pole-4 (554) position to power the primary loop of the secondary condenser of the first rack 561 from the photovoltaic system 407. The first rack secondary condenser valve 533 opens to supply cooling fluid to the primary loop of the secondary condenser of the first rack 561, enabling the secondary cooling loop to enhance the cooling capacity of the primary cooling loop of the first rack 561. In one embodiment, the first rack secondary condenser fan 529 powers on to supply air flow to cool the secondary condenser of the first rack 561.

Analogously, the controller 562 may read the second rack pressure reading 583 to switch the electrical switch to the pole-1 (551) to pole-3 (553) position to power the primary loop of the secondary condenser of the second rack 563 from the photovoltaic system 407. The second rack secondary condenser valve 573 opens to supply cooling fluid to the primary loop of the secondary condenser of the second rack 563, enabling the secondary cooling loop to enhance the cooling capacity of the primary cooling loop of the second rack 563. In one embodiment, the second rack secondary condenser fan 569 powers on to supply air flow to cool the secondary condenser of the second rack 563.

The controller 562 controls the amount of power flowing to the primary loop of the secondary condenser of the first rack 561 or the second rack 563 to change the volumetric flow rate of the cooling liquid through the first rack secondary condenser valve 533 or the second rack secondary condenser valve 573 to regulate individually the cooling capacity of the secondary cooling loop of each rack in response to the vapor pressure measured at the designated locations (e.g., first rack pressure sensor 541 or second rack pressure sensor 583) in the respective rack. In one embodiment, the controller 562 regulates individually the rate of airflow from the first rack secondary condenser fan 529 or the second rack secondary condenser fan 569 in response to the vapor pressure in the respective rack. In one aspect, the controller 562 may monitor the voltages of the photovoltaic system 407 and the storage system 409 to switch the electrical switch to the pole-2 (552) to pole-4 (554) and/or the pole-2 (552) to pole-3 (553) positions to use the storage system 409 to power the primary loop of the secondary condenser of one or both of the first rack 562 and the second rack 563 when the power from the photovoltaic system 407 is not sufficient. In one aspect, the storage system 409 may provide auxiliary power to the IT load as well as powering the secondary cooling loop of the first rack 561 or the second rack 563.

Figure 6:
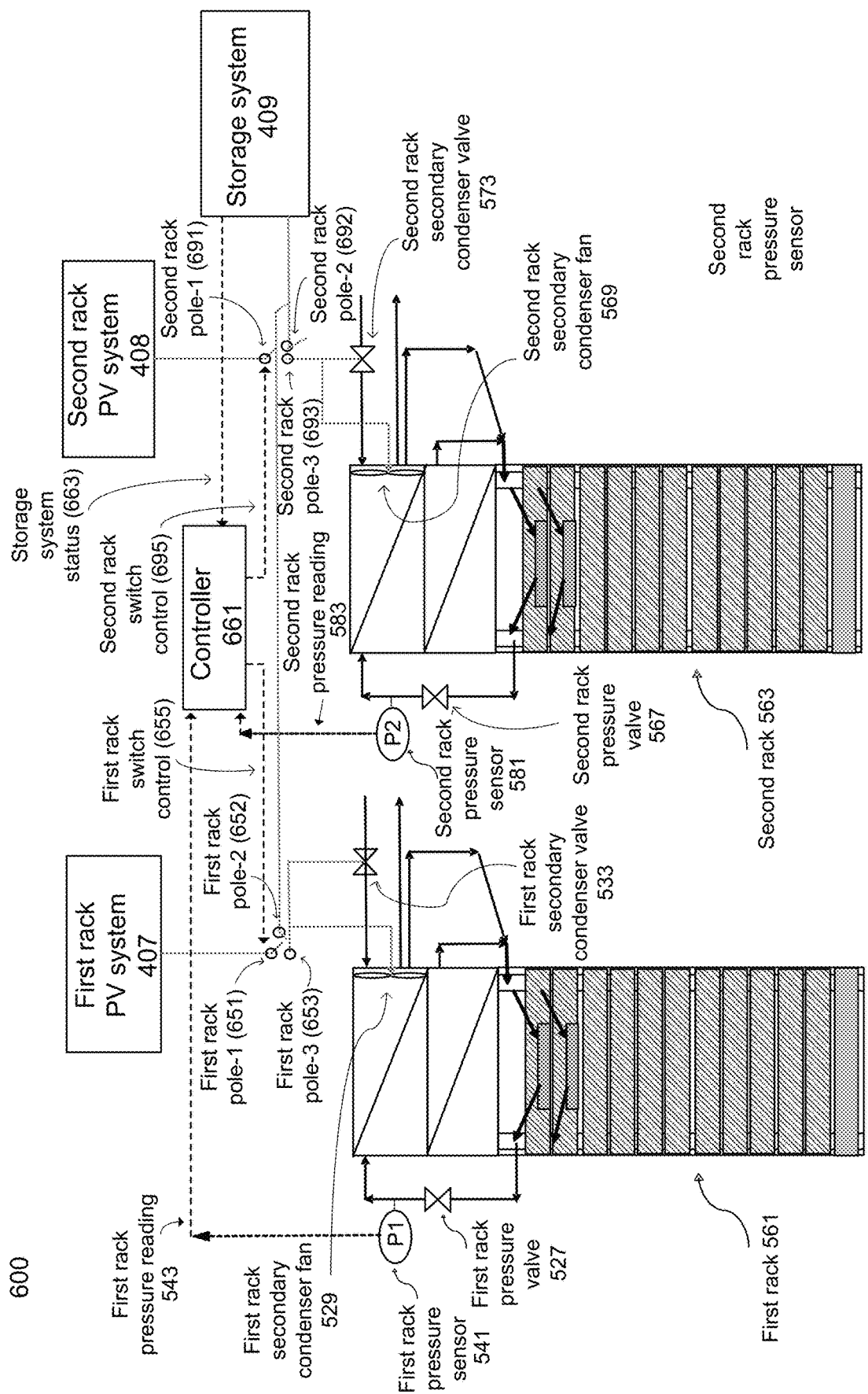
FIG. 6 illustrates an example of a thermal, power, and control architecture of an integrated system that provides a dedicated photovoltaic system for each rack but shares an energy storage system among multiple racks to regulate the cooling capacity and electrical loads of the racks according to one embodiment.

FIG. 6 illustrates an example of a thermal, power, and control architecture of an integrated system 600 that provides a dedicated photovoltaic system for each rack but shares an energy storage system among multiple racks to regulate the cooling capacity and electrical loads of the racks according to one embodiment. Two racks are shown, a first rack 561 and a second rack 563. The thermal architecture of the first rack 561 and second rack 563 are similar to that in FIG. 5, the detailed operations of which are omitted for sake of brevity.

The electrical architecture includes a first rack photovoltaic system 407 dedicated to the first rack 561, a second rack photovoltaic system 408 dedicated to the second rack 563, and a storage system 409 shared between the first rack 561 and the second rack 563. During normal operating condition when the primary cooling loop provides sufficient cooling capacity to the first rack 561, a controller 661 may read a low pressure value of the first rack pressure reading 543 from the first rack pressure sensor 541 to generate a first rack switch control signal 655. The first rack switch control signal 655 may cause an electrical switch of the power distribution system of the first rack 561 to be in the pole-1 (651) to pole-2 (652) switching position to enable the first rack photovoltaic system 407 to charge the storage system 409. In this scenario, the first rack photovoltaic system 407 is not powering the secondary cooling loop of the first rack 561.

When the cooling capacity of the primary cooling loop of the first rack 561 is not sufficient to remove heat from the secondary loop of the primary condenser, the controller 661 may read a high pressure value of the first rack pressure reading 543 to generate the first rack switch control signal 655. The first rack switch control signal 655 may switch the electrical switch of the power distribution system of the first rack 561 to the pole-1 (651) to pole-3 (653) position to power the primary loop of the secondary condenser of the first rack 561 from the first rack photovoltaic system 407. The first rack secondary condenser valve 533 opens to supply cooling fluid to the primary loop of the secondary condenser of the first rack 561, enabling the secondary cooling loop to enhance the cooling capacity of the primary cooling loop of the first rack 561. In one embodiment, the first rack secondary condenser fan 529 powers on to supply air flow to cool the secondary condenser of the first rack 561.

Analogously, when the primary cooling loop provides sufficient cooling capacity to the second rack 563, the controller 661 may read a low pressure value of the second rack pressure reading 583 from the second rack pressure sensor 581 to generate a second rack switch control signal 695. The second rack switch control signal 655 may cause an electrical switch of the power distribution system of the second rack 563 to be in the pole-1 (681) to pole-2 (692) switching position to enable the second rack photovoltaic system 408 to charge the storage system 409. In this scenario, the second rack photovoltaic system 408 is not powering the secondary cooling loop of the second rack 563.

When the cooling capacity of the primary cooling loop of the second rack 563 is not sufficient to remove heat from the secondary loop of the primary condenser, the controller 661 may read a high pressure value of the second rack pressure reading 583 to generate the second rack switch control signal 695. The second rack switch control signal 695 may switch the electrical switch of the power distribution system of the second rack 563 to the pole-1 (691) to pole-3 (693) position to power the primary loop of the secondary condenser of the second rack 563 from the second rack photovoltaic system 408. The second rack secondary condenser valve 573 opens to supply cooling fluid to the primary loop of the secondary condenser of the second rack 563, enabling the secondary cooling loop to enhance the cooling capacity of the primary cooling loop of the second rack 563. In one embodiment, the second rack secondary condenser fan 569 powers on to supply air flow to cool the secondary condenser of the second rack 563.

The controller 661 through the first rack switch control signal 655 controls the amount of power flowing to the primary loop of the secondary condenser of the first rack 561 to change the volumetric flow rate of the cooling liquid through the first rack secondary condenser valve 533 to regulate the cooling capacity of the secondary cooling loop of the first rack 561 in response to the first rack pressure reading 543. In one embodiment, the first rack switch control signal 655 regulates the rate of airflow from the first rack secondary condenser fan 529 in response to the first rack pressure reading 543. Analogously, the controller 661 through the second rack switch control signal 695 controls the amount of power flowing to the primary loop of the secondary condenser of the second rack 563 to change the volumetric flow rate of the cooling liquid through the second rack secondary condenser valve 573 to regulate the cooling capacity of the secondary cooling loop of the second rack 563 in response to the second rack pressure reading 583. In one embodiment, the second rack switch control signal 695 regulates the rate of airflow from the second rack secondary condenser fan 569 in response to the second rack pressure reading 583.

In one aspect, the controller 661 may monitor the voltages of the storage system 409 through the storage system status signal 663 and the voltage of the first rack photovoltaic system 407 to generate the first rack switch control signal 655. The first rack switch control signal 655 may switch the electrical switch of the power distribution system of the first rack 561 to the pole-2 (652) to pole-3 (653) position to power the primary loop of the secondary condenser of the first rack 561 from the storage system 409 when the power from the first rack photovoltaic system 407 is not sufficient. Analogously, the controller 661 may monitor the voltages of the storage system 409 through the storage system status signal 663 and the voltage of the second rack photovoltaic system 408 to generate the second rack switch control signal 695. The second rack switch control signal 695 may switch the electrical switch of the power distribution system of the second rack 563 to the pole-2 (692) to pole-3 (693) position to power the primary loop of the secondary condenser of the second rack 563 from the storage system 409 when the power from the second rack photovoltaic system 408 is not sufficient. In one aspect, the storage system 409 may provide auxiliary power to the IT load as well as powering the secondary cooling loop of the first rack 561 or the second rack 563.

Figure 7:
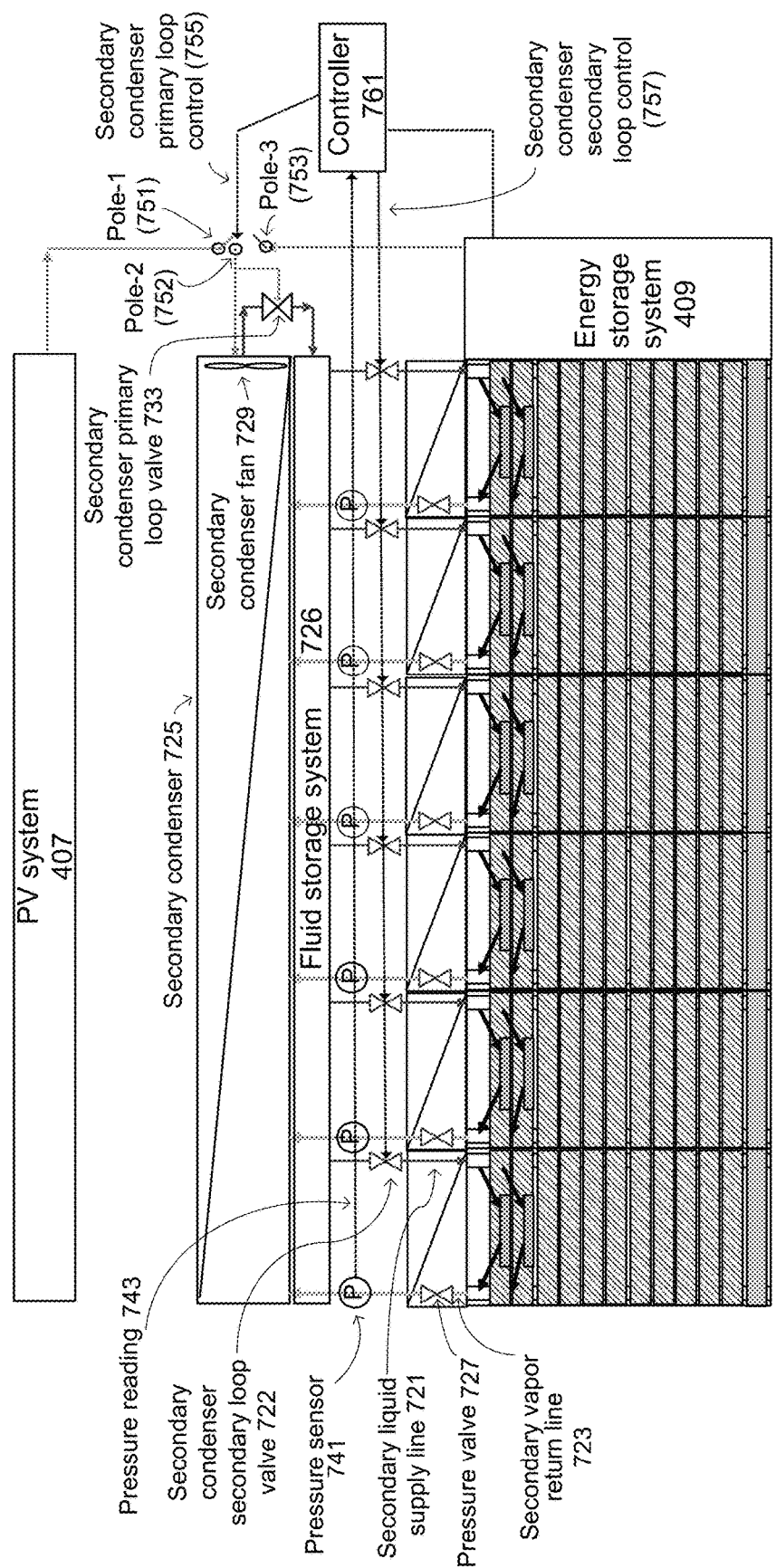
FIG. 7 illustrates an example of a thermal, power, and control architecture of an integrated system that shares a photovoltaic system and an energy storage system to regulate the cooling capacity and electrical loads among multiple racks in which the racks also share a condenser and a fluid storage system of a secondary cooling loop according to one embodiment.

FIG. 7 illustrates an example of a thermal, power, and control architecture of an integrated system 700 that shares a photovoltaic system 407 and an energy storage system 409 to regulate the cooling capacity and electrical loads among multiple racks in which the racks also share a secondary condenser 725 and a fluid storage system 726 of a secondary cooling loop according to one embodiment. Each rack may have a dedicated primary cooling loop (not shown) with a corresponding condenser to perform heat exchange between a primary loop and a secondary loop. As in the other architectures of FIGS. 4-6, the cooling capacity of the primary cooling loop is fixed for each rack. However, unlike the other architectures, the secondary cooling loop is shared among the racks to enhance the cooling capacity of each primary cooling loop.

For the secondary cooling loop, a controller 761 may control a secondary condenser primary loop valve 733 to supply cooling fluid to the primary loop of the secondary condenser 725. In one embodiment, the controller 761 may control the speed of a secondary condenser fan 729 to vary the airflow rate to the secondary condenser 725. The cooled liquid in the secondary loop of the secondary condenser 725 after the heat exchange with the primary loop is returned to the fluid storage system 726. The fluid storage system 726 acts as a system level liquid buffer for the phase change fluid in the secondary loop of the secondary condenser 725. A secondary liquid supply line 721 supplies the phase change fluid from the fluid storage system 726 to each rack through a corresponding secondary condenser secondary loop valve 722. A secondary vapor return line 723 returns the heated vapor from each rack to the secondary condenser 725 to complete the secondary loop of the secondary condenser 725.

Each secondary vapor return line 723 is connected to the secondary condenser 725 through a pressure valve 727. The pressure valve 727 is closed under normal operation when the vapor pressure is low. The pressure valve 727 may open to discharge the heated vapor in the secondary vapor return line 725 from a rack to the secondary condenser 725 when the vapor pressure reaches a trigger pressure threshold. A pressure sensor 741 measures the vapor pressure of each secondary vapor return line 723 on the discharge side of the pressure valve 727. The controller 761 may read the pressure reading 743 from each pressure sensor 741 to generate a secondary condenser secondary loop control signal 757. The secondary condenser secondary loop control signal 757 controls the secondary condenser secondary loop valve 722 to regulate the volumetric flow rate of phase change fluid supplied to the secondary liquid supply line 721 for a rack in response to the vapor pressure of the corresponding secondary vapor return line 723 for the rack. As shown, since there is a shared fluid storage system 726 between the racks, each individual secondary liquid supply line 721 between the fluid storage system 726 and the rack is assembled with a secondary condenser secondary loop valve 722. Then the secondary condenser 725 is connected to the fluid storage system 726. Each of the primary condenser dedicated for each rack may be directly connected to the rack liquid cooling distribution directly. Individual control of the cooling capacity of the secondary cooling loop for each rack from a shared secondary condenser 725 increases cooling efficiency and performance while lowering the cost.

During normal operating condition when the primary cooling loop for each rack provides sufficient cooling capacity, the pressure valves 727 for all of the racks may be closed. The controller 761 may read the low pressure values on the pressure readings 743 from all of the racks to cause an electrical switch to be in the pole-1 (751) to pole-3 (753) switching position to enable the photovoltaic system 407 to charge the energy storage system 409. In this scenario, the photovoltaic system 407 is not powering the secondary cooling loop of all the racks.

When the cooling capacity of the primary cooling loop for a rack is not sufficient to remove heat from the secondary loop of the corresponding primary condenser, the vapor pressure in the secondary vapor return line 723 for the rack may exceed the triggered pressure threshold of the corresponding pressure valve 727. The pressure valve 727 may open to discharge the heated vapor to the secondary condenser 725. The pressure sensor 741 for the rack may produce a high pressure reading. The controller 761 may read the pressure reading 743 for the rack to switch the electrical switch to the pole-1 (751) to pole-2 (752) position to power the primary loop of the secondary condenser 725. The secondary condenser primary loop valve 733 opens to supply cooling liquid to the primary loop of the secondary condenser 725. As discussed, the controller 761 may also open the secondary condenser secondary loop valve 722 to regulate the volumetric flow rate of phase change fluid supplied to the rack in response to the pressure reading 743, enabling the secondary cooling loop to enhance the cooling capacity of the primary cooling loop for the rack. In one embodiment, the first rack secondary condenser fan 729 powers on to supply air flow to cool the secondary condenser 725.

In one aspect, the controller 761 may monitor the voltages of the photovoltaic system 407 and the energy storage system 409 to switch the electrical switch to the pole-3 (753) to pole-2 (752) position to use the energy storage system 409 to power the primary loop of the secondary condenser 725 when the power from the photovoltaic system 407 is not sufficient. In one aspect, the energy storage system 409 may be powered by the main utility power. In one aspect, the energy storage system 409 may provide auxiliary power to the IT load as well as powering the secondary cooling loop of the racks. In one aspect, the energy storage system 409 may power the primary cooling loops of the racks. The photovoltaic system 407 and the energy storage system 409 acts as a system level electrical buffer of the power distribution system.

Figure 8:
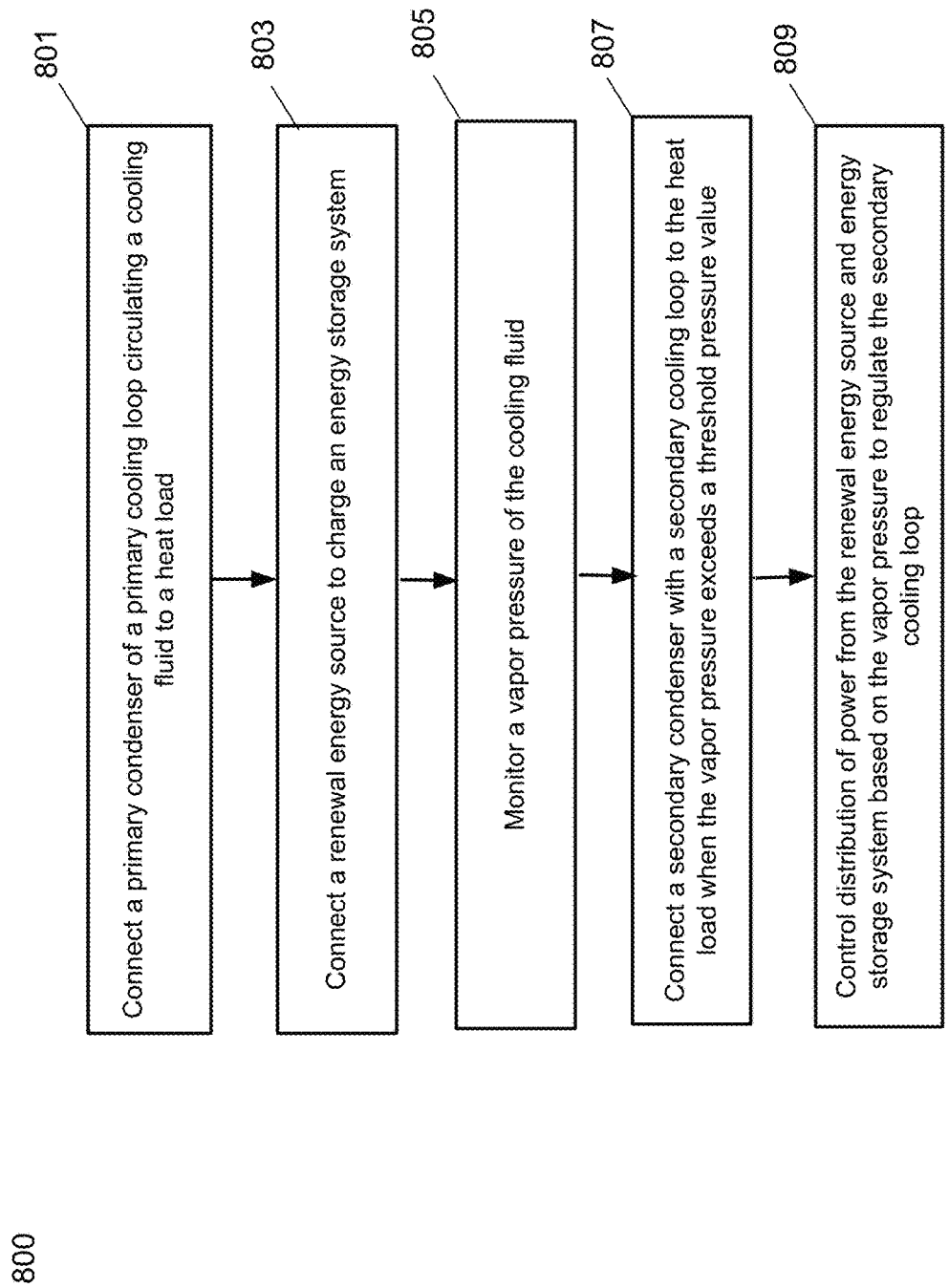
FIG. 8 is a flow diagram illustrating an example of a method for regulating the cooling capacity and electrical load of electronic equipment in a data center or computer system in response to the thermal and power density according to one embodiment.

FIG. 8 is a flow diagram illustrating an example of a method 800 for regulating the cooling capacity and electrical load of electronic equipment in a data center or computer system in response to the thermal and power density according to one embodiment. In one embodiment, the method 800 may be performed by the integrated thermal and electrical systems 400, 500, 600, 700 of FIG. 4, 5, 6, or 7. In one aspect, the method 800 may be performed utilising hardware logic, or combinations of hardware logic and programmable registers that store configuration values.

In operation 801, the method 800 connects a primary condenser of a primary cooling loop that circulates a cooling fluid to the heat load of the electronic equipment. In one aspect, the cooling fluid may be a phase change fluid. Operation 801 may connect the liquid supply line and the vapor return line of a secondary loop of the primary condenser to remove heat from the heat load.

In operation 803, the method 800 connects a renewable energy source to charge an energy storage system. In one aspect, the renewable energy source may be a photovoltaic system and the energy storage system may be a rechargeable battery.

In operation 805, the method 800 monitors the vapor pressure of the cooling liquid such as the vapor pressure of the phase change fluid at the discharge side of the pressure based valve. The vapor pressure may increase when the cooling capacity of the primary cooling loop is insufficient for the heat load or when there is a high power load associated with the electronic equipment.

In operation 807, the method 800 connects a secondary condenser of a secondary cooling loop to the heat load when the vapor pressure exceeds a threshold pressure value. In one aspect, a pressure valve may be triggered to open when the vapor pressure exceeds the threshold pressure value. When the pressure valve opens, a secondary loop of the secondary condenser may be connected to the heat load and a primary loop of the secondary condenser may be connected to a liquid supply line. The cooling capacity of the secondary cooling loop supplements the cooling capacity of the primary cooling loop.

In operation 809, the method 800 controls the distribution of power from the renewable energy source and the energy storage system based on the vapor pressure to regulate the secondary cooling loop. In one aspect, if the power from the renewable energy source is sufficient, the renewable energy source may power the secondary cooling loop to control the cooling capacity of the secondary cooling loop in response to the vapor pressure. In one aspect, if the power from the renewable energy source is insufficient, the energy storage system may power the secondary cooling loop to control the cooling capacity of the secondary cooling loop in response to the vapor pressure.

Various configurations, layouts, and assemblies of the integrated thermal and electrical systems with self-regulating capabilities as described provide enhanced cooling capacity and auxiliary power to support high thermal and power density requirements of computer systems or data centers. The integrated design of the primary and secondary cooling loops for the thermal system, the photovoltaic system and the energy storage system for the power distribution system, and the self-regulating control of the thermal and storage systems provide efficient thermal and power management of high performance IT clusters, increasing cooling performance, cooling reliability, power efficiency, system scalability, sustainability requirements, and lowering cost to meet the demands of high heat and power densities.

In the foregoing specification, embodiments of the invention have been described with reference to specific exemplary embodiments thereof. It will be evident that various modifications may be made thereto without departing from the broader spirit and scope of the invention as set forth in the following claims. For example, the primary and secondary cooling loops may monitor the fluid temperature of a cooling fluid to regulate the cooling capacity of the secondary cooling loop instead of monitoring the vapor pressure of the phase change fluid. The photovoltaic system may be another renewable energy source powered by the thermal energy from the cooling loops, wind, biomass, etc. The specification and drawings are, accordingly, to be regarded in an illustrative sense rather than a restrictive sense.

What is claimed is:

1. A liquid cooling apparatus of a data center, comprising:
a primary cooling loop having a primary condenser to remove heat from one or more information technology (IT) components using a cooling liquid, the primary cooling loop having a cooling capacity under normal operation;
a sensor to monitor a vapor pressure of the cooling liquid;
a secondary cooling loop having a secondary condenser, the secondary condenser being connected to close the secondary cooling loop to enhance the cooling capacity of the primary cooling loop under normal operation to remove heat from the one or more IT components when the vapor pressure of the cooling liquid exceeds a threshold value; and
a power distribution system including a renewable energy source and an energy storage system configured to distribute power to connect the secondary condenser to the secondary cooling loop and to control a cooling capacity of the secondary cooling loop in response to the vapor pressure.

2. The liquid cooling apparatus of claim 1, wherein the secondary condenser is disconnected from the secondary cooling loop when the vapor pressure does not exceed the threshold value, and wherein the renewable energy source is configured to charge the energy storage system when the secondary condenser is disconnected.

3. The liquid cooling apparatus of claim 1, wherein the renewable energy source is configured to distribute power to connect the secondary condenser to the secondary cooling loop and to control the cooling capacity of the secondary cooling loop in response to the vapor pressure when a power of the renewable energy source is sufficient, and the energy storage system is configured to distribute power to connect the secondary condenser to the secondary cooling loop and to control the cooling capacity of the secondary cooling loop in response to the vapor pressure when the power of the renewable energy source is insufficient.

4. The liquid cooling apparatus of claim 1, further comprising a secondary condenser valve configured to supply the cooling liquid to the secondary condenser, and wherein the power distribution system is configured to open the secondary condenser valve to allow the cooling liquid to flow into the secondary condenser when the secondary condenser is connected to the secondary cooling loop.

5. The liquid cooling apparatus of claim 4, wherein the power distribution system is configured to control the secondary condenser valve to adjust a volumetric flow rate of the cooling liquid into the secondary condenser to control the cooling capacity of the secondary cooling loop in response to the vapor pressure.

6. The liquid cooling apparatus of claim 1, further comprising a secondary condenser fan configured to supply airflow to the secondary condenser, and wherein the power distribution system is configured to turn on the secondary condenser fan when the secondary condenser is connected to the secondary cooling loop.

7. The liquid cooling apparatus of claim 6, wherein the power distribution system is configured to control the secondary condenser fan to adjust a rate of the airflow to control the cooling capacity of the secondary cooling loop in response to the vapor pressure.

8. A data center system, comprising:
a power distribution system including at least one renewable energy source and at least one energy storage system;
a plurality of electronic racks, each electronic rack containing a plurality of server chassis and each server chassis corresponding to one or more servers, wherein each electronic rack comprises:
a primary cooling loop having a primary condenser to remove heat from the servers using a cooling liquid, the primary cooling loop having a cooling capacity under normal operation;
a sensor to monitor a vapor pressure of the cooling liquid; and
a secondary cooling loop having a secondary condenser, the secondary condenser being connected to close the secondary cooling loop to enhance the cooling capacity of the primary cooling loop under normal operation to remove heat from the servers when the vapor pressure of the cooling liquid exceeds a threshold value;
wherein the power distribution system is configured to distribute power to connect the secondary condenser to the secondary cooling loop and to control a cooling capacity of the secondary cooling loop in response to the vapor pressure.

9. The data center system of claim 8, wherein each electronic rack further comprises one of the renewable energy source and one of the energy storage system, and wherein the secondary condenser is disconnected from the secondary cooling loop when the vapor pressure does not exceed the threshold value, and wherein the renewable energy source for the electronic rack is configured to charge the energy storage system for the electronic rack when the secondary condenser is disconnected.

10. The data center system of claim 8, wherein each electronic rack further comprises one of the renewable energy source and one of the energy storage system, and wherein the renewable energy source for the electronic rack is configured to distribute power to connect the secondary condenser to the secondary cooling loop and to control the cooling capacity of the secondary cooling loop in response to the vapor pressure when a power of the renewable energy source is sufficient, and the energy storage system for the electronic rack is configured to distribute power to connect the secondary condenser to the secondary cooling loop and to control the cooling capacity of the secondary cooling loop in response to the vapor pressure when the power of the renewable energy source is insufficient.

11. The data center system of claim 8, wherein each electronic rack further comprises a secondary condenser valve configured to supply the cooling liquid to the secondary condenser, and wherein the power distribution system is configured to open the secondary condenser valve to allow the cooling liquid to flow into the secondary condenser when the secondary condenser is connected to the secondary cooling loop.

12. The data center system of claim 11, wherein the power distribution system is configured to control the secondary condenser valve to adjust a volumetric flow rate of the cooling liquid into the secondary condenser to control the cooling capacity of the secondary cooling loop in response to the vapor pressure.

13. The data center system of claim 8, wherein each electronic rack further comprises a secondary condenser fan configured to supply airflow to the secondary condenser, and wherein the power distribution system is configured to control the secondary condenser fan to adjust a rate of the airflow to control the cooling capacity of the secondary cooling loop in response to the vapor pressure.

14. The data center system of claim 8, wherein a flow rate of the cooling liquid in the primary condenser or a cooling airflow rate through the primary condenser is constant to provide a constant cooling capacity for the primary cooling loop.

15. The data center system of claim 8, wherein the renewable energy source and the energy storage system are configured to be shared among the plurality of electronic racks to individually connect the secondary condenser to the secondary cooling loop and to individually control the cooling capacity of the secondary cooling loop of each electronic rack in response to the vapor pressure monitored by the sensor.

16. The data center system of claim 8, wherein each electronic rack further comprises one of the renewable energy source, wherein the energy storage system is shared among the plurality of electronic racks, and wherein the power distribution system is configured to distribute power from the renewable energy source for the electronic rack or the shared energy storage system to individually connect the secondary condenser to the secondary cooling loop and to individually control the cooling capacity of the secondary cooling loop of each electronic rack in response to the vapor pressure monitored by the sensor.

17. The data center system of claim 8, wherein each electronic rack further comprises a valve, wherein the plurality of electronic racks shares the secondary condenser, and wherein the power distribution system is configured to distribute power to the valve for each electronic rack to individually control the cooling capacity of the secondary cooling loop of each electronic rack in response to the vapor pressure monitored by the sensor.

18. A method of regulating a heat load and an electrical load of an electronic equipment, comprising:
   connecting a primary condenser of a primary cooling loop to circulate a cooling liquid to remove heat from the electronic equipment, the primary cooling loop having a cooling capacity under normal operation;
   connecting a renewable energy source to charge an energy storage system;
   monitoring a vapor pressure of the cooling liquid;
   connecting a secondary condenser to a secondary cooling loop to enhance the cooling capacity of the primary cooling loop under normal operation in removing heat from the electronic equipment when the vapor pressure of the cooling liquid exceeds a threshold value; and
   distributing power from the renewable energy source and the energy storage system to regulate a cooling capacity of the secondary cooling loop based on the vapor pressure.

19. The method of claim 18, further comprising:
   disconnecting the secondary condenser from the secondary cooling loop when the vapor pressure does not exceed the threshold value; and
   charging the energy storage system from the renewable energy source when the secondary condenser is disconnected.

20. The method of claim 18, wherein distributing power from the renewable energy source and the energy storage system to regulate the cooling capacity of the secondary cooling loop comprises:
   controlling a volumetric flow rate of the cooling liquid flowing into the secondary condenser to regulate the cooling capacity of the secondary cooling loop based on the vapor pressure; or
   controlling a rate of airflow into the secondary condenser to regulate the cooling capacity of the secondary cooling loop based on the vapor pressure.

* * * * *